United States Patent [19]
Hayashi

[11] Patent Number: 5,457,457
[45] Date of Patent: Oct. 10, 1995

[54] DIGITAL TO ANALOG CONVERSION DEVICE WHICH DECREASES LOW LEVEL HIGH FREQUENCY NOISE

[75] Inventor: Hideaki Hayashi, Shirakawa, Japan

[73] Assignee: Nippon Columbia Co., Ltd., Tokyo, Japan

[21] Appl. No.: 162,704

[22] Filed: Dec. 7, 1993

[51] Int. Cl.[6] .................................................... H03M 1/66
[52] U.S. Cl. .......................................... 341/144; 341/152
[58] Field of Search ................................. 341/144, 152, 341/118, 143

[56] References Cited

U.S. PATENT DOCUMENTS

| | | | |
|---|---|---|---|
| 4,709,224 | 11/1987 | Fiori, Jr. | 341/144 |
| 5,021,788 | 6/1991 | Ueki et al. | 341/152 |
| 5,245,345 | 9/1993 | Kohdaka et al. | 341/152 |
| 5,298,899 | 3/1994 | Oh et al. | 341/132 |
| 5,307,064 | 4/1994 | Kudoh | 341/144 |

*Primary Examiner*—Marc S. Hoff
*Attorney, Agent, or Firm*—Young & Thompson

[57] ABSTRACT

A system and method for the conversion of digital signals to analog signals increases the resolution of the output analog signal beyond the analog quantization size associated with the given input digital word length. The rate of change of the Least Significant Bits (LSB) is detected. The "square waves" produced by changes in the polarity of the LSB correspond to low amplitude signals comprising audible high frequency components. The high frequency noise associated with these detected low signal levels is attenuated by digital low pass filters of varying cut-off frequencies at the output stage. This creates a signal of a resolution higher than the step size inherent in the length of the input digital word, and reduces high frequency noise at low signal amplitudes, resulting in a smooth analog output signal.

3 Claims, 11 Drawing Sheets

INPUT WAVEFORM

FIG. 1(a)
PRIOR ART

OUTPUT WAVEFORM

DIGITAL TO ANALOG CONVERSION DEVICE WHICH DECREASES LOW LEVEL HIGH FREQUENCY NOISE

BACKGROUND OF THE INVENTION

This invention relates to the conversion of digital data to an analog signal. Digital data is frequently stored on a storage medium as a series of digital words of fixed length. The finite nature of the word length is a primary limitation on the fidelity of the audio output. It follows from this limitation that the number of output states is limited to $2^n$, where n represents the number of bits in the stored digital word. Therefore, a 16 bit A/D converter can represent 65,536 output states. The resolution of this A/D converter is therefore 1/65,536. In practice, this means that if an analog signal changes by an amount smaller than the resolution of the converter, both signals will be assigned the same digital word. In theory, the higher the resolution (using a higher n value), the higher the fidelity of the converted output signal to the quantized input signal. In applications such as digital audio, for example, nonlinearities in the conversion from digital to analog create distortion that is primarily audible as noise at low levels. One example of such noise is zero-cross distortion. The zerocross distortion caused by the switching of LSBs causes distortion to appear as higher frequency signals at multiples of the input frequency.

In an effort to improve the accuracy of conversion, some manufacturers have resorted to converting 16 bit digital data by oversampling the data, that is sampling the digital data at a multiple of the input sampling frequency. This results in a word length higher than that of the stored word length. The most significant bits are then converted and the least significant bits are either rounded off or used in noise shaping circuits to enhance the linearity of low amplitude signals, as they contain amplitude information below that contained by the most significant bits. Linearity measures the ability of the converter to output a signal proportional to the level of the signal prior to quantization. In a perfect D/A converter, a change of 1 LSB corresponds exactly to a change of $1/2^n$ of the Full Scale value used to quantize the input analog signal.

The compact disk (CD) system utilizes a format wherein digital data is stored as 16 bit words sampled at 44.1 Khz. Recently, converters utilizing 18 or 20 bit (or higher) architectures have been employed to provide a more accurate conversion of the 16 bit data words stored on the compact disk. One such converter is disclosed in Japanese patent publication Sho 55-28445 which utilizes a "noise shaping" circuit that uses 18 or 20 bit data to decrease the low signal level distortion present in decoded audio signals. However, even this "noise shaping" scheme has the effect of increasing high frequency noise at low amplitude levels, thereby impairing sound quality.

When the LSB switches from one state to another as the amplitude of the signal changes, the converted signal resembles a square wave whose amplitude, in the time domain, is determined by the resolution of the converter divided by the Full Scale value of the analog input signal. The width of this square wave is determined by the rate of change of the analog input signal, that is, its frequency. This square wave, being the decoded LSB signal, represents low level signals. However, due to its shape, its spectral content is determined by a sum of sinusoids determined by the Fourier decomposition of the signal. These sinusoids are of higher frequency than the input signal and are heard as high frequency noise in the decoded analog signal. This distortion is unwanted and impairs the quality of the recovered sound.

OBJECTS OF THE INVENTION

Accordingly, it is a principal object of the present invention to provide a system and a method to convert digital data to analog signals while greatly reducing the high frequency distortion of the decoded analog signals, even at low signal levels.

It is a further object of the present invention to provide a digital to analog conversion system wherein input data changes, as well as spaces or intervals between the data changes are detected, and differentiated data of a magnified length are created below that of the least significant bits, thereby smoothing out the sequence of the changing LSB data.

SUMMARY OF THE INVENTION

The above and other objects according to the invention are achieved in an apparatus and method to convert digital data to an analog signal wherein the apparatus includes a detector to detect low level square waves. The timing pattern formed by changes in the Least Significant Bit(s) (LSB) are detected. This data pattern is then routed to one of a plurality of digital low pass filters of different cut-off frequencies. These digital low pass filters output a pattern which is representative of smaller changes than the change indicated by the LSB of the original data word. These filtered words are then converted to a smoothed analog signal which does not comprise audible high frequency noise.

BRIEF DESCRIPTION OF THE DRAWINGS

FIG. 1 shows a comparison between a prior art AD/DA conversion of a 16 bit, −90 dB sine wave.

FIG. 7 shows (a) the filter-thru wave shape according to the prior art, (b) that obtained using filter F1, and (c) a diagram showing the replicated output which passes through filter F2, by means of the output wherein the bits are subjected to two-bit amplification.

FIGS. 15(a)–(d) are diagrams of various other signals output from the circuit diagramed in FIG. 13.

DETAILED DESCRIPTION OF PREFERRED EMBODIMENTS ACCORDING TO THE INVENTION

Figure 1A:
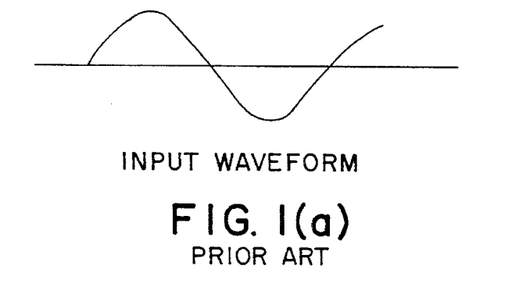
FIG. 1(a) is the input signal before the AD/DA conversion and FIG. 1(b) is the output wave shape.
Figure 1B:
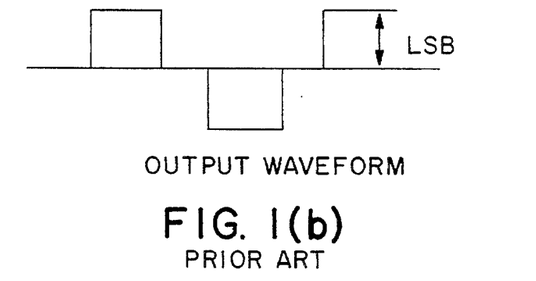

A diagram of a conventional prior art AD/DA conversion of a low level signal is shown in FIG. 1. FIG. 1 (a) represents the low amplitude −90 dB input wave before the A/D conversion and FIG. 1(b) represents the D/A converted waveform. The height of the output waveform is 1 LSB, and therefore represents the lowest amplitude signal the D/A converter is able to process. Since the output waveform resembles a square wave, its spectral content is determined by a weighted sum of progressively higher frequency sinusoids. These are heard as high frequency noise in the decoded analog signal, and result in a large amount of audible impairment of the output analog signal, even at low signal levels.

Figure 2:
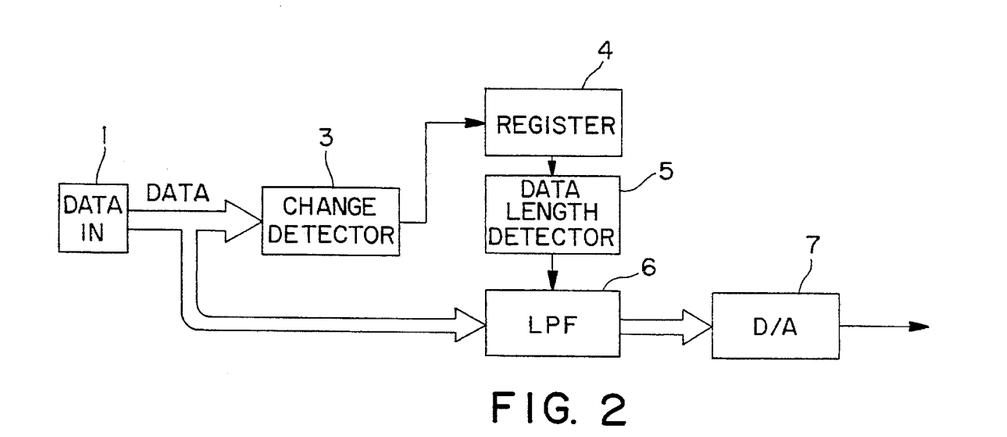
FIG. 2 is a block diagram of an embodiment of the present invention.

An embodiment of the present invention is shown in FIG. 2. The circuit represented by the block diagram detects particular data waveforms from the digital input data (DATA IN 1). The digital input data may originate from any medium able to store data in digital form such as, for example, a Compact Disk (CD). The Change Detector 3 determines whether there is a change of the LSB from one sample to the next, whether there has been no change, and whether there are changes at levels above the LSB.

Figure 3A:
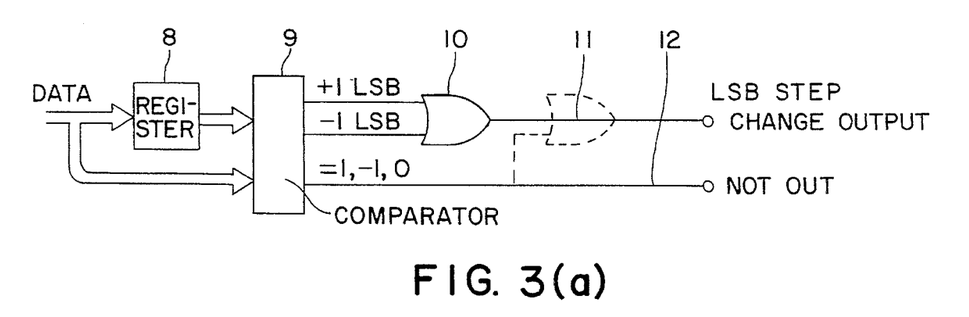
FIG. 3(a) is a block diagram of the change detector and FIG. 3(b) is a timing diagram showing the change detector output signals as they vary according to the LSB data.

FIG. 3(a) shows a block diagram of an embodiment of this Change Detector 3. Input data DATA IN is compared by comparator 9 which compares the current data word with the previous data word stored in register 8, which holds the incoming data word for one clock cycle. Comparator 9 outputs signals indicative of the differences between the current and the delayed signal, and a signal indicating no change in the LSB position. If the change between the current and previous signals is on the order of 1 LSB, a +1 LSB signal or a −1 LSB output signal appears on the comparator output, depending on whether the LSB has been set or reset, respectively. Where the signal does not change from one data word to the next, both outputs are 0. Also, when the data changes at levels above the LSB, an output indicative of that state can be obtained as well.

Figure 3B:
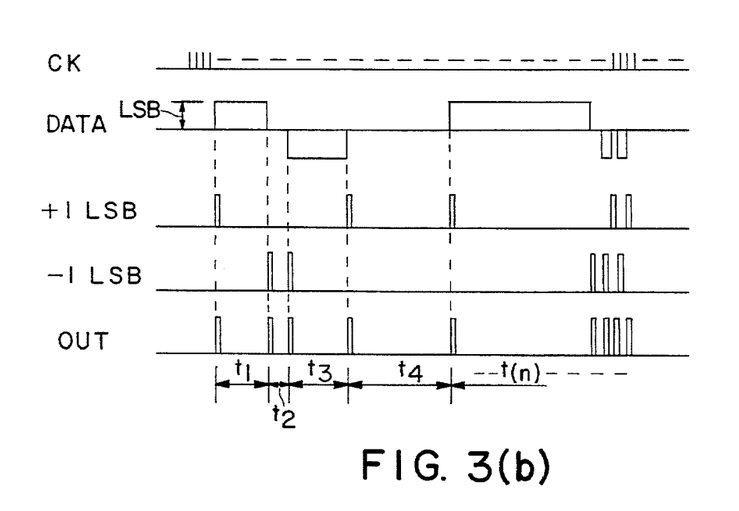

A timing diagram of the comparator output signals in shown in FIG. 3(b). If the input data changes by + or −1 LSB between successive data words, the comparator outputs a signal on the + or −LSB lines respectively. In order to generate a pulse for each change of + or −1 LSB, the OR gate 11 is used to detect any rising or falling edge in the LSB data. The output of OR gate 11, the LSB step change output, therefore exhibits a pulse whenever either of the + or −LSB lines is asserted.

Figure 4:
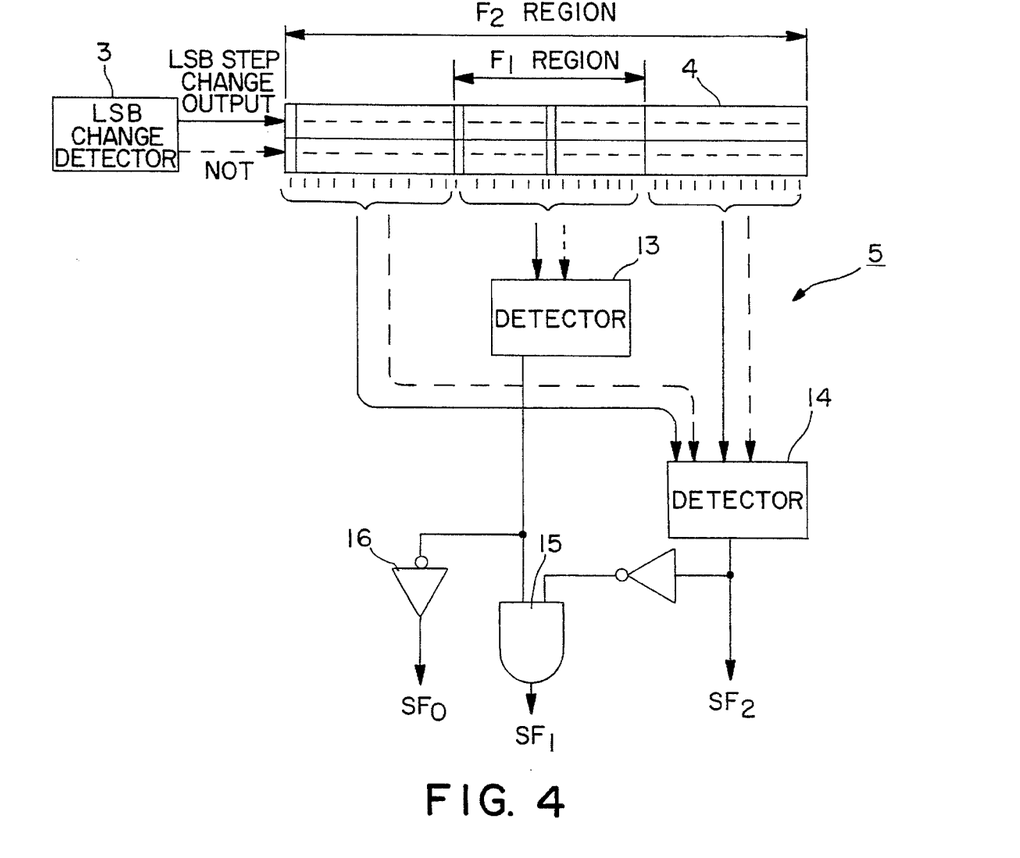
FIG. 4 is a block diagram of the data length detector 5 shown in FIG. 2.

By measuring the space between the pulses generated on the OUT line, that is, the time between them, approximately half of the frequencies present in the data may be detected. The detection of the time interval of the spaces between the data (t1–tn) can be obtained from the LSB step change output line 11 or the NOT OUT line 12. This detection of the space between LSB changes is possible because the comparator does not output a pulse when the change from one data word to the next exceeds 1 LSB in magnitude. These pulses are then output to the shift register 4. The width of the shift register must be one half of the inverse of the frequency to be detected, times the sampling frequency. For example, at a sampling frequency of 44.1 Khz, greater than 50 sample segments are required to detect a frequency of 444 Hz. $((1/441)/(1/44100)*1/2)$ If the output from each stage of register 4 does not include two inversions within a fixed time period, it is a long cycle or a low frequency data. Because of this, the data length detector 5 is comprised of means for detecting one inversion (or lack thereof) in a single datum. In this instance, if the frequency bands are categorized as high, midlevel and low frequency bands, then, as shown in FIG. 4, by means of detector 13 which detects frequency bands which are lower than the mid-level frequency band, measurements can be made of the many parameters on both sides from within the register. This may be accomplished by a simple adder or by a counter, by which a count is made of the values between each of the numbers 1. If this number 1 is less than one, the output of detector 13 will so indicate. If it is greater than two, it will not be output. Because of this, upon passing through inverter 16, there is no need for a digital filter $SF_0$, there being simply a sample clock removal analog filter at its output. In the same manner, by means of the detector 14 which detects the 1 LSB of the registered output of the entire band region, detection is made of low frequencies.

Figure 5:
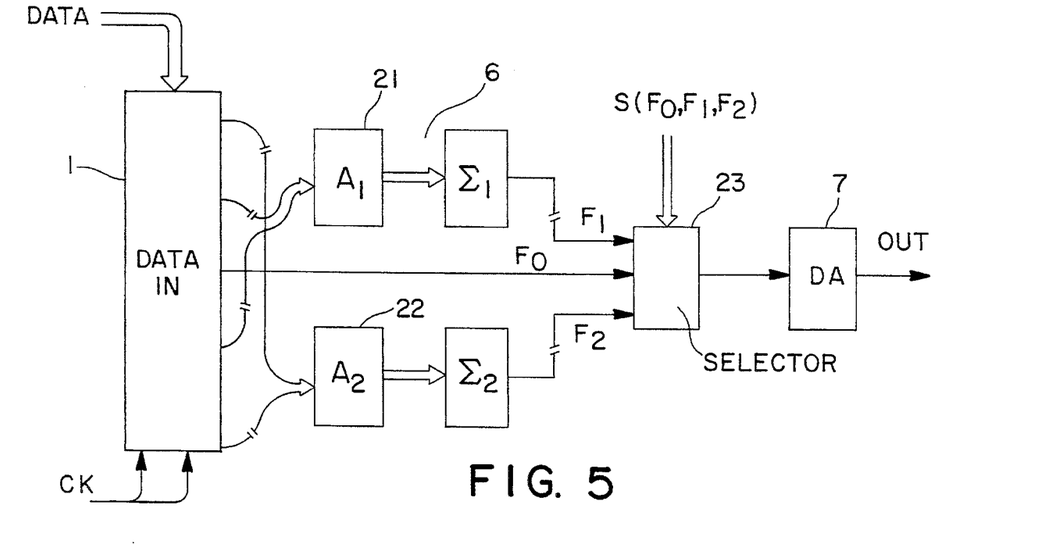
FIG. 5 is a block diagram of the digital low pass filter 6 shown in FIG. 2.
Figure 6:
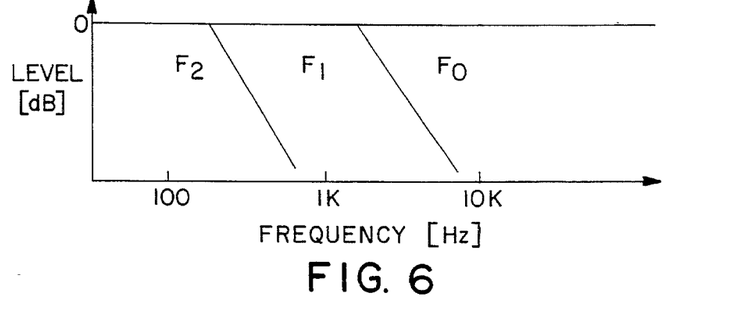
FIG. 6 is a diagram showing the cut-off frequency characteristics of the digital low pass filter shown in FIG. 5.

On the other hand, the digital data 1 corresponds to the detector output F0, F1, F2 which detects the transversal filter by means of the digital low pass filter 6 shown in FIG. 5. As is shown in the example of filter characteristics in FIG. 6, 2 low pass filters 21 and 22 are present. The cut-off frequency characteristics of these low pass filters 21 and 22 are simply such that the wave shape is smoothed out, owing to which a simple 12 dB/oct filter would be sufficient. In this instance, it is necessary that the timing of the data of the output of the selector 23 and the timing of the output of this filter be synchronous. By this means, filters 21 and 22 output calculated results which are of lower resolution than the LSB, and which is made possible by bit magnification, through the utilization of the DA converter 7.

Figures 7A, 7B, 7C:
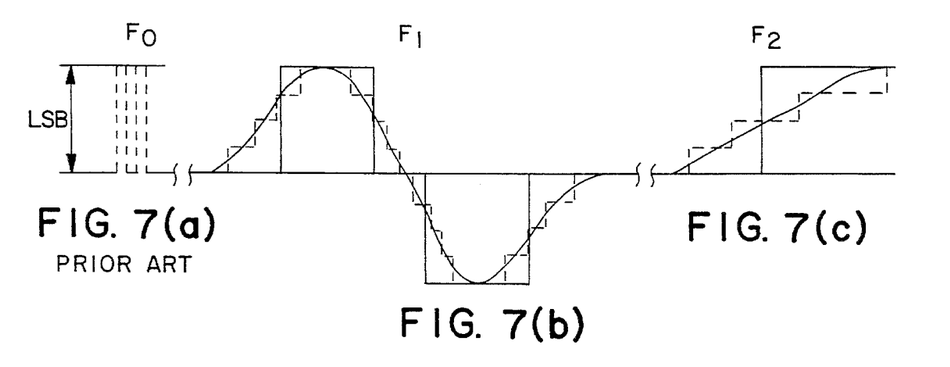

FIG. 7 shows an example of bit magnification wherein 2 bits are increased in 4 stages. The dashed line represents the prior art analog output, whereas the solid line represents the output of this invention. FIG. 7(a) represents the high frequency LSB data as it appears in the prior art. Output is accomplished by means of the filter detection of F0, which is the same as that of the prior art. In this instance, for example at high frequencies such as 10 KHz, not only is rounding accomplished by the low pass prior art analog filter, but even at slightly low frequencies, there is no problem with respect to distortion at high frequencies which cannot be heard. Generally, at several KHz, the sine waves cannot be differentiated.

In FIG. 7(b) which shows data in the medium range, F1 is selected. In FIG. 7(c), selection is made of F2, and owing to the filtration of low cut-off frequencies (as shown in FIG. 7(b), signals of about 1 KHz obtained from F1 lose higher order distortion. In addition, even at low frequencies such as 100 Hz, (as is shown in FIG. 7(c), the data is smoothed out. Furthermore, in increasing the results, the number of bits is increased, and the number of filters can also be increased.

Figure 8:
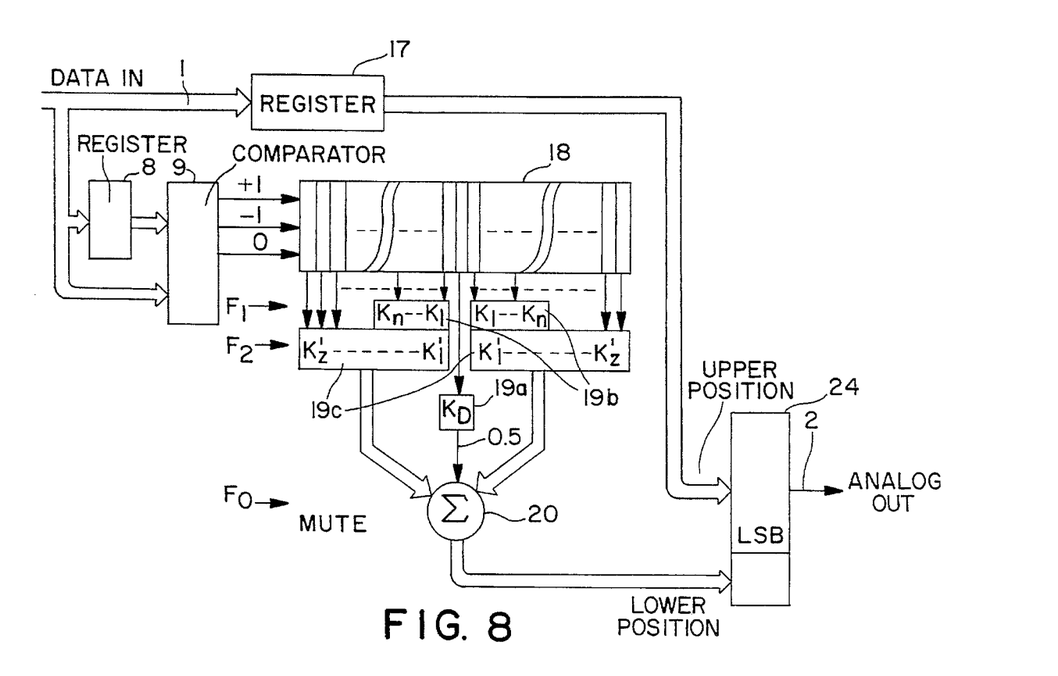
FIG. 8 is a block diagram of another embodiment of the represent invention.
Figure 9:
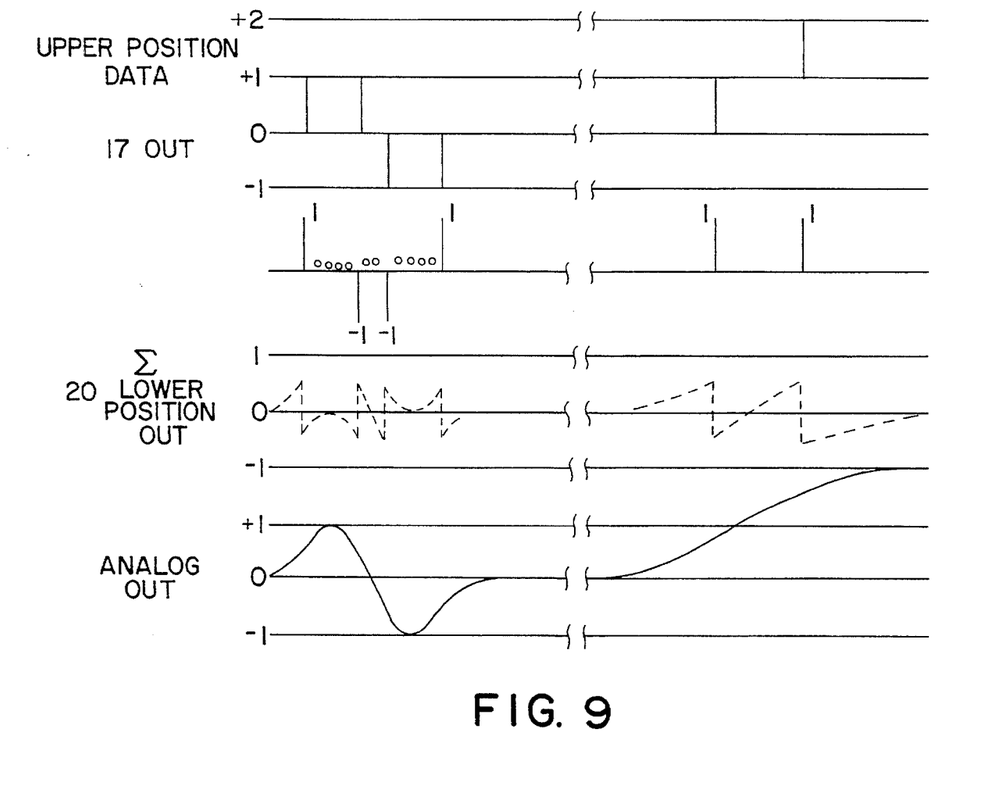
FIG. 9 is a timing diagram of the signals of FIG. 8.

Here, the digital filters handle 16 bit data, and the output also requires bit magnification. FIG. 8 shows another improved embodiment of this invention, and FIG. 9 shows the wave shapes obtained therefrom. In this instance, formation is accomplished of lower position bits only from data which is designated as +1, −1, or 0 as output from the comparator 9 shown in FIG. 3, thereby accomplishing D/A conversion by means of DA convertor 24 along with the upper position prior art bits. Here, lower position bit data is obtained through the addition of accumulated numbers which correspond to +1 or −1 points obtained from the shift register of the ±1 LSB step signals for smoothing out the product of LSB changes.

The digital DATA IN 1 shown in FIG. 3 delays only sample components corresponding to the lower position bit output timing which pass through register 17. On the other hand, as shown in FIG. 2, filters are selected by means of the detection of LSB step changes etc. in data. In lieu of the data input through the previous digital filter, utilization is made only of the output of comparator 9, in which data is represented as +1, 0, or −1 (2 bit realizations also being possible) and said data is input into register 18, shifts being accomplished after each sample. Here, if from each register stage, a 1 or a −1 is obtained, then all of the data passing through data coefficient multiplier 19b of accumulated ROM from K1–Km and −K1—Km can be calculated by adder 20, and output. As shown in FIG. 9, if the output of central data coefficient multiplier 19a is 0.5, then in coefficient multiplier 19c K'1 is close to 0.5, and K'z is close to 0, with respect to which unit pulses a value is input corresponding to the low pass filter. Of course, this may also be the sign approximation or the interpolated data. After the center, the polar interpolated output is K1–Km or the same.

According to this, as the data 1 approaches the center, the level increases which accompany the value of K become approximately equal to +0.5, and at the center they become −0.5, becoming 0 as they are removed from center. As shown in FIG. 9, as additions are made to accompany the input of data, lower position data is obtained through the bit magnified lower position data of the signals corresponding to the wave shapes of the accumulated data output 20 (Σ, lower position) for the output data (upper position) of the square wave shape DA converted by means of the upper position data. The analog output which constitutes a compilation of upper position and lower position (data) provides a smooth output such as the data OUT depicted in FIG. 9.

Figure 10:
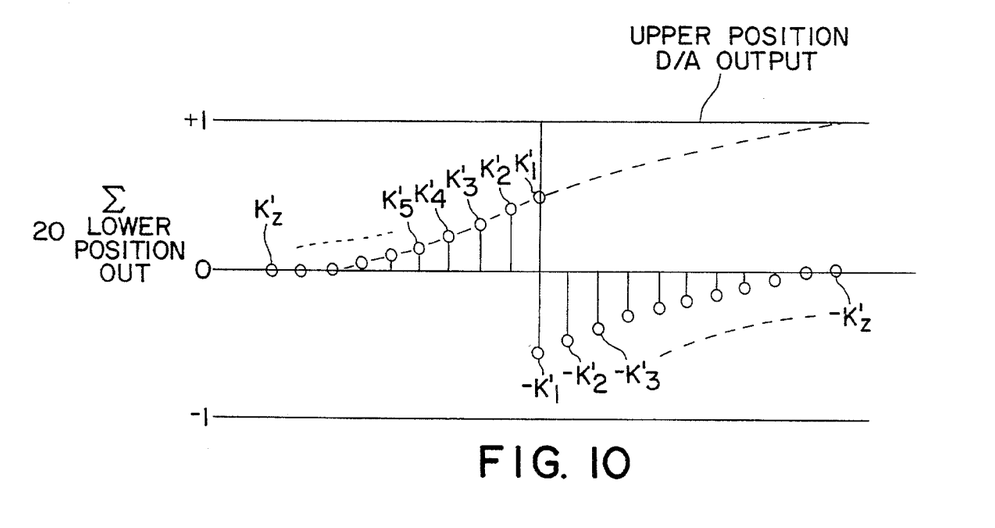
FIG. 10 is a detail of the lower position Σ OUT signal of FIG. 8.

These lower position bits utilize independent D/A converters, which align the LSB level of the upper position converter forming an analog composition which can be output. In addition, through the selection of a board filter, the value of K can be output as shown in FIG. 10 for appropriate lower position bit data obtained by means of the data pattern length in which K'1–K'z and multiple constants are prepared.

The detection of lower position bit formations of the filter component or of data patterns can be programmed and accomplished by means of a digital processor. Two types of multiple filters have been described. However, even one type is effective, and conversely the frequency band can be broadened if they are increased. In addition, a description has been provided with respect to data patterns the objective of which was LSB step changes. However, fs conversion accomplished by means of digital filters, or a so-called sample system can accomplish bit magnification in order to prevent the occurrence of replicated noise. With this type of output, since the target is LSB steps prior to bit magnification, it is necessary to detect LSB steps which are greater than those which have been magnified.

As has been explained above, patterns of minute level change components in data rows can be detected, and can be followed by lower position bits, by which means great improvements can be effected with respect to distortion.

In another embodiment of this invention, minute level high frequency noise is reduced, and bit length is increased, in order to accomplish DA conversion. Because of this, differences between the sample data of replicated digital signals detect components which are lower than the minute level changes of 1 LSB or 2 LSB. A low pass filter stage is attached to remove high frequency noise with respect to the interspersed spaces introduced within these parameters. With this type of low pass filter stage output, the input bit length can be increased, and output to a level below that of the input LSB, thereby effecting an improvement in noise or distortion by smoothing out the signals which are then devoid of high region noise.

Figure 11:
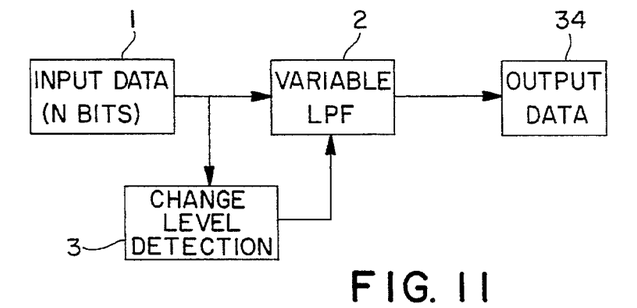
FIG. 11 is a functional block diagram of an embodiment of the present invention.

FIG. 11 is a block diagram showing a simplified diagram of the invention. Input data 1 which is obtained from n bits, is input into a variable low pass filter 2, and then output. At ordinary levels, this low pass filter 2 is a pass through filter or with CD's this LPF is a digital filter having a cutoff frequency of 20 KHz.

In addition, with this low pass filter 2, by changing the coefficient of the filter, it can be made selectable so as to be decreased lower than multiple KHz. The calculated results of the filter are cut out by the input of N bits, the bit length being magnified to the upper position bit length, and output. With respect to (n+m bits), generally, 20 or 18 bits are effective to smooth out high frequency noise.

If detector 3 is utilized to detect small level changes in the input data through the detection of differences between the samples of input data, then this objective can be accomplished through the utilization of a leading low pass filter. In other words, with low level components, or at especially low frequencies, changing LSB levels can be smoothed out, and at the time of output, smooth replication signals can be obtained which lack the above-described high region noise.

Figure 12:
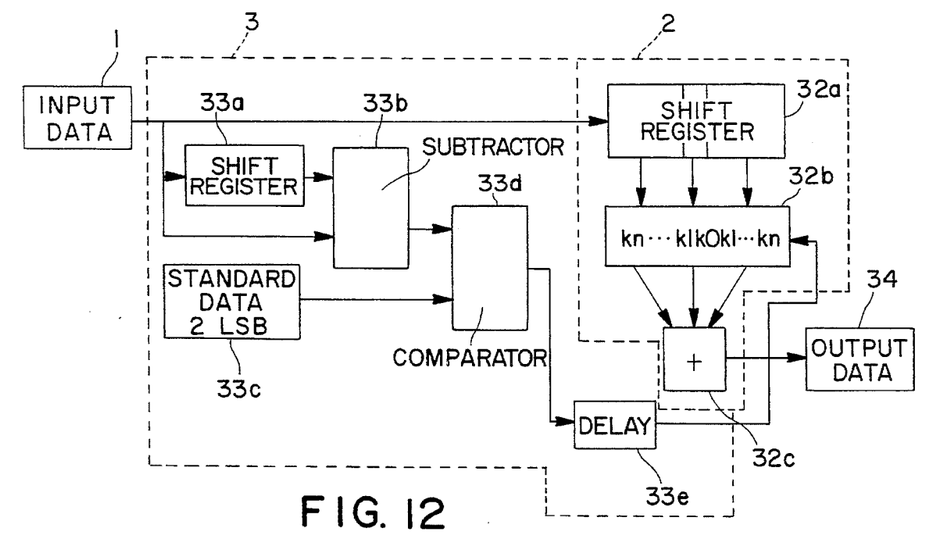
FIG. 12 is a detailed block diagram of the embodiment of FIG. 11.

FIG. 12 shows a practical block diagram of FIG. 11. Input data 1 is sampled and held in shift register 33a, differences in the input sample data and its output being subjected to a reduction by means of subtractor 33b, thereby extracting the differences in data. This output is input to comparator 33d, a determination being made with respect to the value of the standard data 33c, i.e. the minute level detection, and input being made of 1 LSB and 2 LSB, thereby extracting the value which is lesser than this value.

On the other hand, the input data 1 is entered into the low pass filter 32, and output. In this instance, low pass filter 32 utilizes a coefficient register which is necessary to the filter calculations by means of shift register 32a. From the output of each of the register 32a, a product is obtained by multiplier 32b of the coefficients extending from Ko–Kn which are necessary to the filter, calculations being accomplished by means of the overall adder 32c, resulting in filtered output 34.

In this instance, if, with respect to the central register, the coefficient Ko is 1, and the others are 0, then the data is passed through unchanged. If the coefficient K0–Kn is changed, then a variable cutoff low pass filter can be actualized. This filter coefficient can be converted through the output of level detection comparator 33d. Here, the output timing of the filter, and the output timing of comparator 33d may be different, in which case some alignment will be necessary. In FIG. 12, the output of comparator 33d is aligned by inputting the delay circuit 33e.

Figure 14:
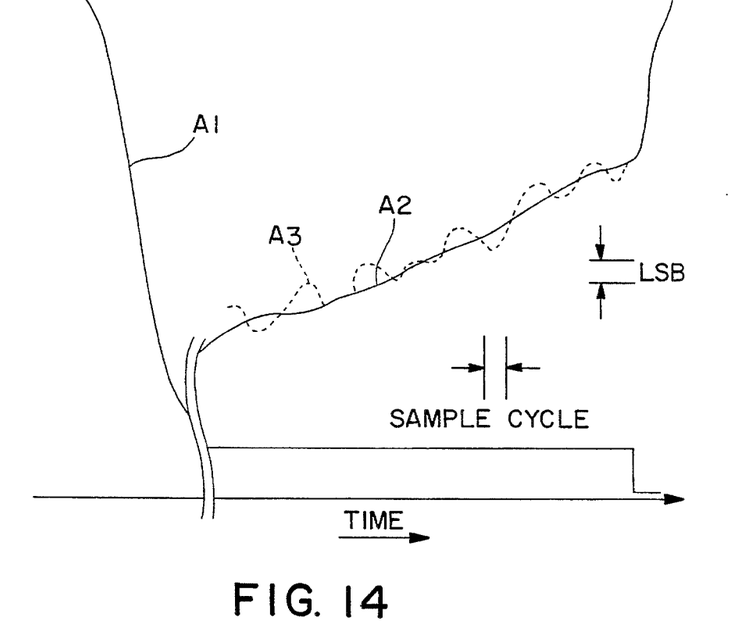
FIG. 14 is a diagram of signals output from the circuits diagramed in FIGS. 11 and 13.

The operation of the present invention will be described with reference to FIG. 14. 'A' corresponds to the output data of the filter at the time of DA conversion. If as is the case with A1, the data between each samples changes greatly, then the filter becomes a fixed broad band 20 KHz filter. As shown in the prior art example for A3, the filter becomes a low frequency filter by means of the small change components of 1 LSB changes. And as shown in the prior art example of A3 which is output in the same manner as is line A2, then even if there is some LSB change related high level noise, it can be attenuated.

In addition, when there is a replication of a general high frequency signal, it is generally at a level larger than 1 LSB or 2 LSB, hence there is no deterioration in the frequency characteristics.

Figure 13:
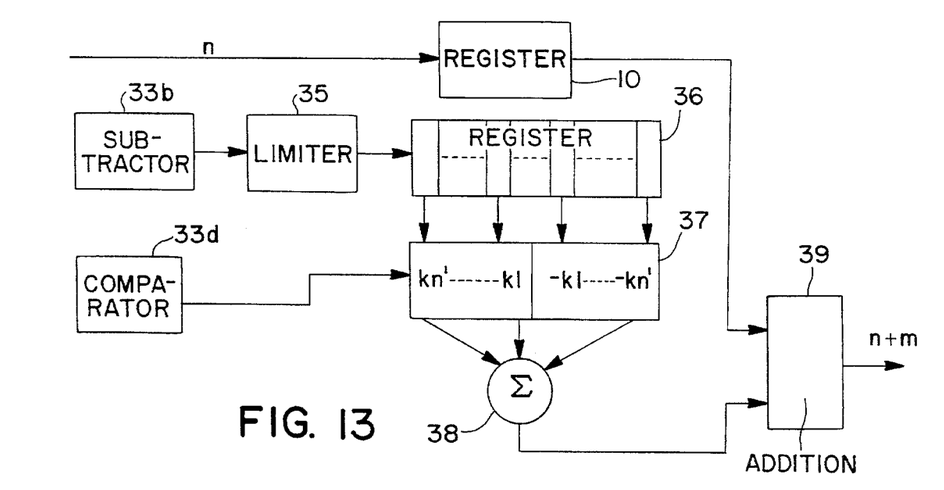
FIG. 13 is a block diagram of another embodiment of the present invention.

FIG. 13 shows another embodiment of this invention. In FIG. 12, it is necessary for filter calculations to be accomplished with respect to the entire 16 bit input data. However, if the filters are large, then this can be simply accomplished as shown in FIG. 13. In other words, the differences in input data can be extracted, and through the utilization of only target level change data for which the filters were converted, filter calculations can be accomplished. The output of subtractor 33b which constitutes the differential output can be made equal to the necessary fixed level by means of limiter 35. In other words, with respect to changes which are below the resolution of 1 LSB, if utilization is made of a filter, then all of the changes above 1 LSB can be output in terms of + or −1. This output is input to shift register 36. With the output of this shift register, the formation of lower position bits can be accomplished of the input of n bit data, adding the upper position bits, and thereby obtaining low pass characteristics.

Figures 15A, 15D:
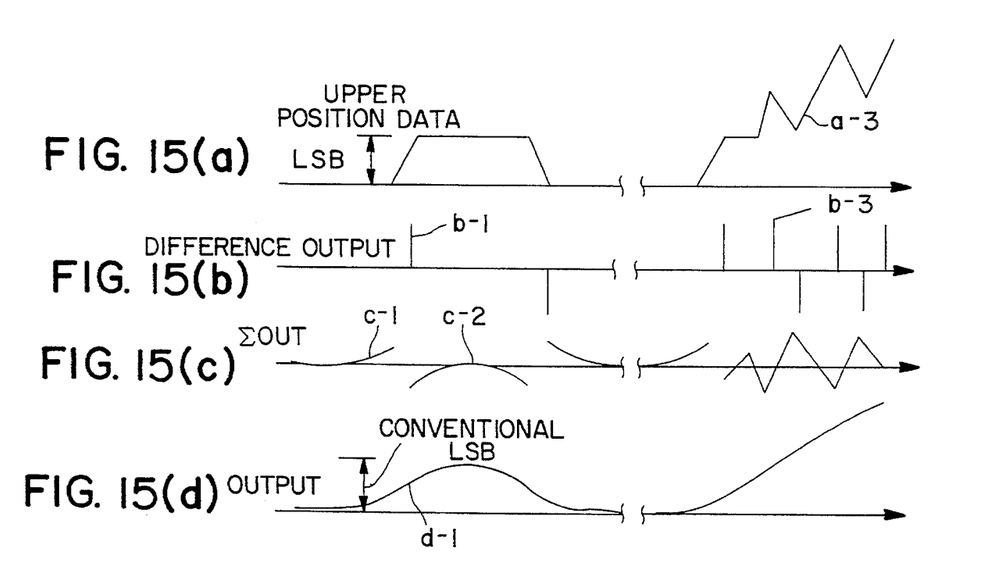

FIG. 15 is a diagram which describes these waveforms. When the upper position input bit data is changed by 1 LSB in the manner shown in (a), the differential output becomes as is shown in (b-1). While (b-1) shifts shift register 36, coefficient Kn–K1 is calculated by means of coefficient multiplier 37. The output from the overall adder 38 is given a coefficient which outputs (c-1). If the medium range is exceeded, then it is established that there is a reverse output such as (c-20). The output of the overall adder 38 and the data from the upper position n calculated by adder 39 is filtered in the manner shown in (d-1) of (d), and the lower position bits are made into a smooth signal by magnification. In the same manner, when the input data includes high region noise components which have been slowly changed, such as in (a-3), the differential output is output as multiple outputs. This output is added by overall adder 38 in the manner shown in (c). The output of adder 39 becomes a smooth signal which does not contain high region noise, such as is shown in (d).

With minute level replication such as is described above, not only is there a reduction in distortion, but even with those components which are recorded with 'noise shaping', there is an attenuation of high region noise, and output close to that of the original re-emerges, even with the transmission of only a small number of bits. Nor is there a deterioration in frequency characteristics at ordinary levels.

Figure 16:
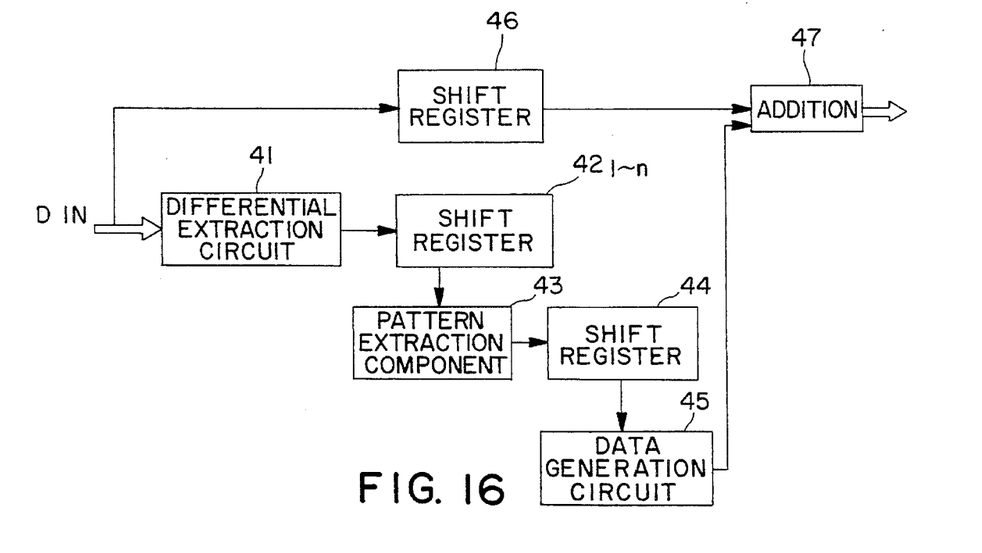
FIG. 16 is a block diagram of another embodiment of the present invention.
Figure 17:
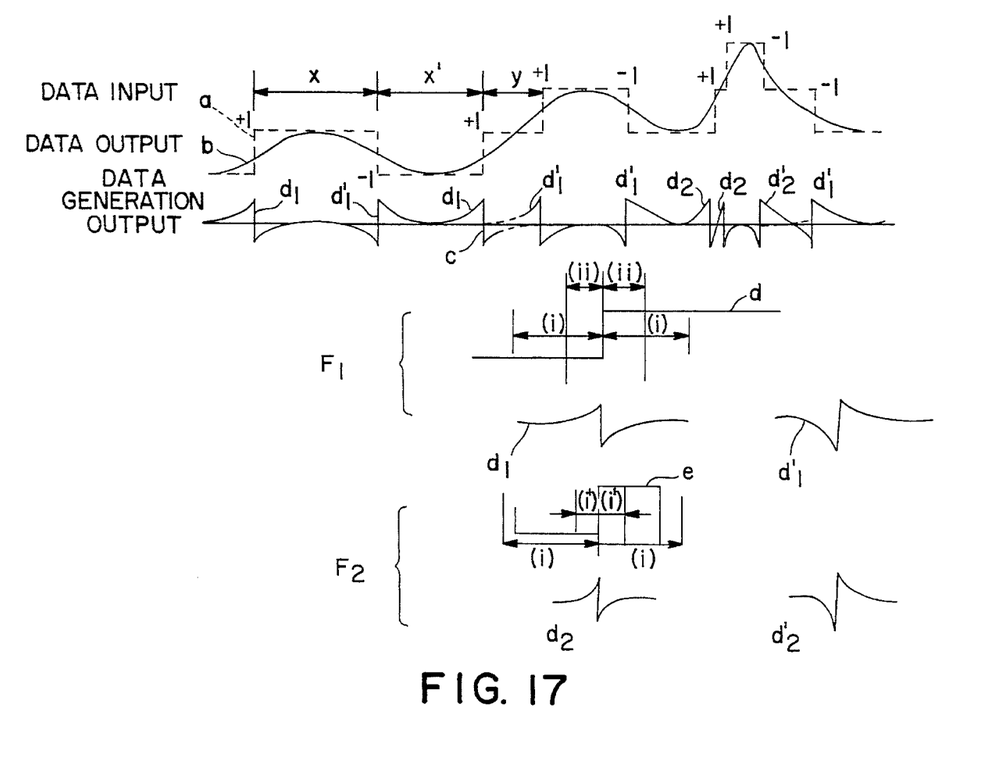
FIG. 17 shows signals as they appear from various points in the block diagram of FIG. 16.

In addition, yet another embodiment of this invention is described with reference to the block diagram 16 which follows. FIG. 16 is a block diagram which shows the overall form of this invention, whereas FIG. 17 is a diagram which shows the wave shape obtained therefrom. Data D in which follows each 'word' sample obtained from the replicated bits of limited length detects data between the sample data by means of differential extraction circuit 41.

Figure 18:
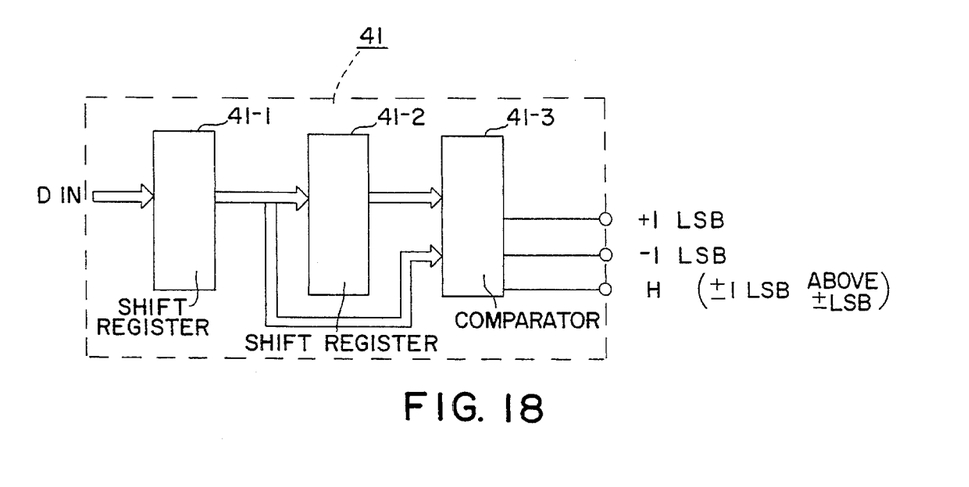
FIG. 18 is a block diagram of the differential extraction circuit component 41 of FIG. 16.

Shift registers 41-1, and 41-2 clock the data following each of the sample clocks fs, the data between each of these 1 samples being compared by means of comparator 41-3. The same data between each of the 1 samples is divided into data having no change, which is output as 0; data having a +1 LSB change, and data having a −1 LSB change. In addition, differential extraction is accomplished of even greater large amplitude changes H, etc. Next, the differential data is input into shift register 42. In order to detect these shift patterns wherein the numbers are aligned with the objectives in terms of number—number 10 samples, input is accomplished so that shifting is accomplished within shift register 42 by means of a sample clock.

The data in shift register 42 is extracted in minute level changes, as well as in (frequency) change intervals. In other words, pattern extraction is accomplished, and data formation is established so as to correspond to 1 LSB change by means of small level changes.

By means of pattern extraction component 43, lower position data of magnified length is created corresponding to LSB changes according to the sample distance in the LSB change points, as shown in FIG. 17. At this time an explanation will be provided with respect to the 2 formation stages of a) data formation F1 which corresponds to a relatively smooth low frequency component, and b) F2 which represents high frequency components.

According to the 1 LSB change points in the positive direction, intervals of −1 LSB changes $_x$ in which interim samples show no data changes, and conversely intervals $_{x'}$ which range from −1 to +1 exist as above (i) as shown in d. In addition, if intervals of the same polarity are such that (y) is above (ii), then the output of F1 is output to correspond to the 1 LSB change points obtained from pattern extraction component 3. Also, as shown in e, when $_x$ is less than (i), then if it is above (i'), then F2 is output. (In this instance, utilization is not made of (ii), and when the input H accompanies the output F1, F2, then no output is made.)

The data F1 and F2 is shifted within shift register 44, on the basis of the patterned output data. In the process, data is respectively created as shown in d2 and d2', which corresponds to d1 and d1', and F2, which corresponds to F1 which follows each sample. By adding these, data of magnified length is created, and added to the upper position data, thereby accomplishing DA conversion in the form of magnified length bit data. At this time, in order to align the upper position data, with the same position as the data formation output, phase alignment is carried out by means of shift register 46.

By means of the upper position data of input data a shown in FIG. 17, the extracted data for each of the LSB change point patterns is as shown by the broken line in c of FIG. 17, in which the formation output of the solid line can be obtained through the addition of all of these. The composite output into which the upper position data has been added enables one to obtain smooth wave shapes in which there is no distortion, such as is shown in FIG. 17(b).

Figure 19:
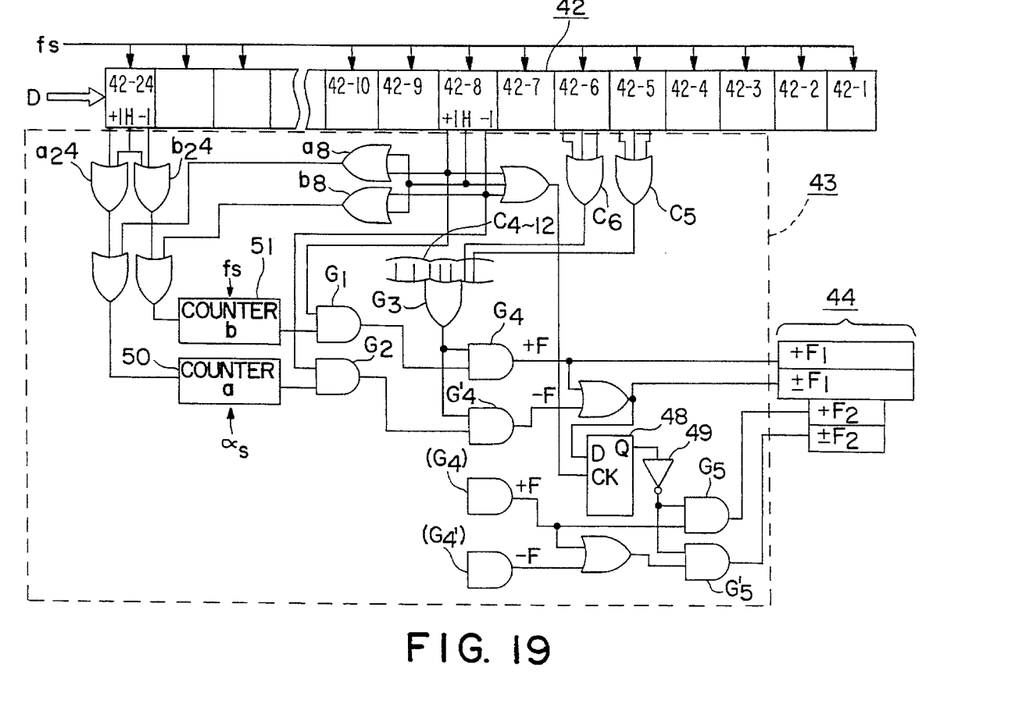
FIG. 19 is a block diagram of the pattern extraction circuit component 43 of FIG. 16.

Hereafter follows a detailed description of each component. First, an explanation concerning the pattern extractor 43 shown in FIG. 19 will be made. The output F1 is shown wherein the front of (i) is greater than 17 samples, and (ii) is greater than 5 samples. According to the output of register 42-24 and 42-8, the OR of +1 LSB and H are taken by OR circuit a24 and a8, by means of which OR counter a50 is cleared, and in the same manner, with an OR of −1 and H, counter b51 is also cleared. These counters a50 and b51 count up to 16 samples, and effect an output on the 17th sample. The output of counter b51 which was cleared by means of reverse polarity when the output of register 42-8 was +1 or −1, and the output of counter a50 and (AND gate) G1 and G2 are used to establish the gates, detection being made of condition (i) wherein there are no LSB changes within the 16 sample sequence of + or −1 LSB change in the register 42-8 points, and no H signals.

Figure 20:
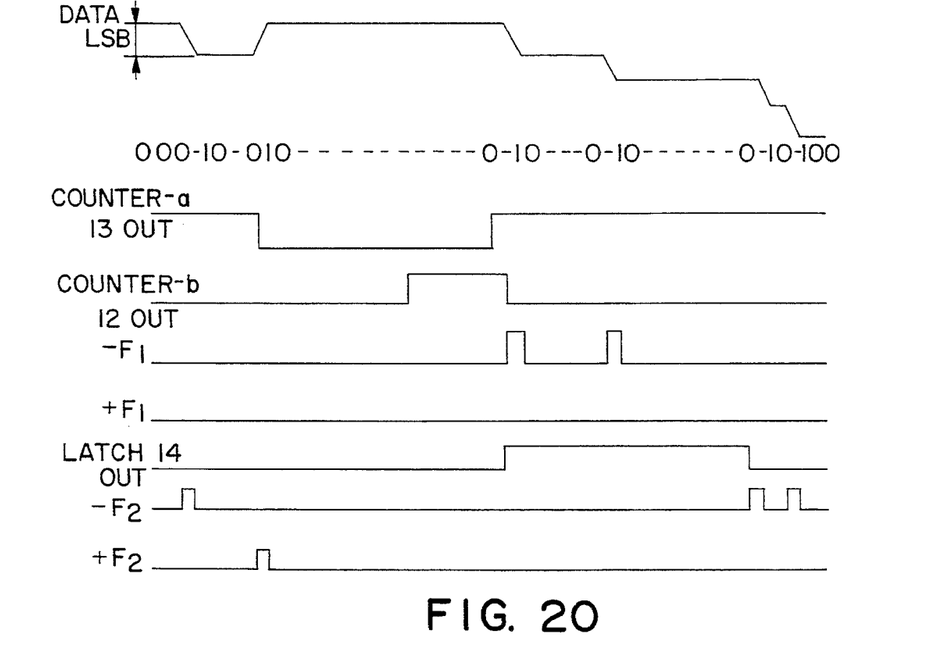
FIG. 20 is a timing diagram which shows the sequence of the signals in the shift register 44 of FIG. 16.

In addition, this output is put into the register 42-8 detecting the OR gate C4–C12 of the output of the + or −4 sample register 42-12, taking the respective (AND gate) of the (AND gate) G4 as well as the (AND gate) G4'. This then becomes the state shown in (ii). In this instance, input is accomplished for other than the same polarity by means of C4– C12. However, if there is reverse polarity, or an H signal, then only the conditions shown in (ii) are established, without the establishment of G1 or G2. This output is then input into register 44. In addition, with respect to F2, in the same manner, it is useful to establish the position extracted from shift register 42, as well as the value of the counter. If the condition (i') of F2 exceeds 5 samples, then it corresponds to the register 42-8 of F1, also corresponding to the output of register 42-24, becoming 42-12, it being desirable for the counter to count ½ of 8 samples. In addition, in this instance it is not necessary for it to correspond to OR gate G3. Here, if the output of F1 corresponds to one of the 1 LSB changes, then in order for there to be an alignment with the conditions of F2, then F1 is produced, and F2 is not output. Because of this, the OR gate of + or −F1 is taken, and through invertor 49 which latches the flag of F1 on latch 48 following each change in data, if F1 exists with respect to gate G5 or G5', then F2 can be prevented. By this means, F1 only outputs long cycles, and F2 only outputs short cycles, and both are not output at the same time. According to this, either of the outputs F1 F1', F2 F2' may be input into shift register 44 in correspondence with fixed 1 LSB change points, and shifted. In this instance, shift register 44 is such that the input timing of F1 and F2 utilized for the creation of data corresponds to register 42-8 and 42-4, and so that the 4 sample F2 can be subsequently output; if there is a delay in the 4 sample component input, then the timing will be aligned. FIG. 20 shows the referenced state of F1–F2. Here, it may be convenient if the degree of the output from shift register 44 takes the OR of +F1 or −F1; this enables the accomplishment of a sign bit which shows heterogeneity by means of +F1 with change points, through + or −F1 signals (+ or −1 LSB) and +F1, i.e. + or −1 LSB. In the same manner, + or −F2 and sign bits may be input into shift register 44.

Figure 21:
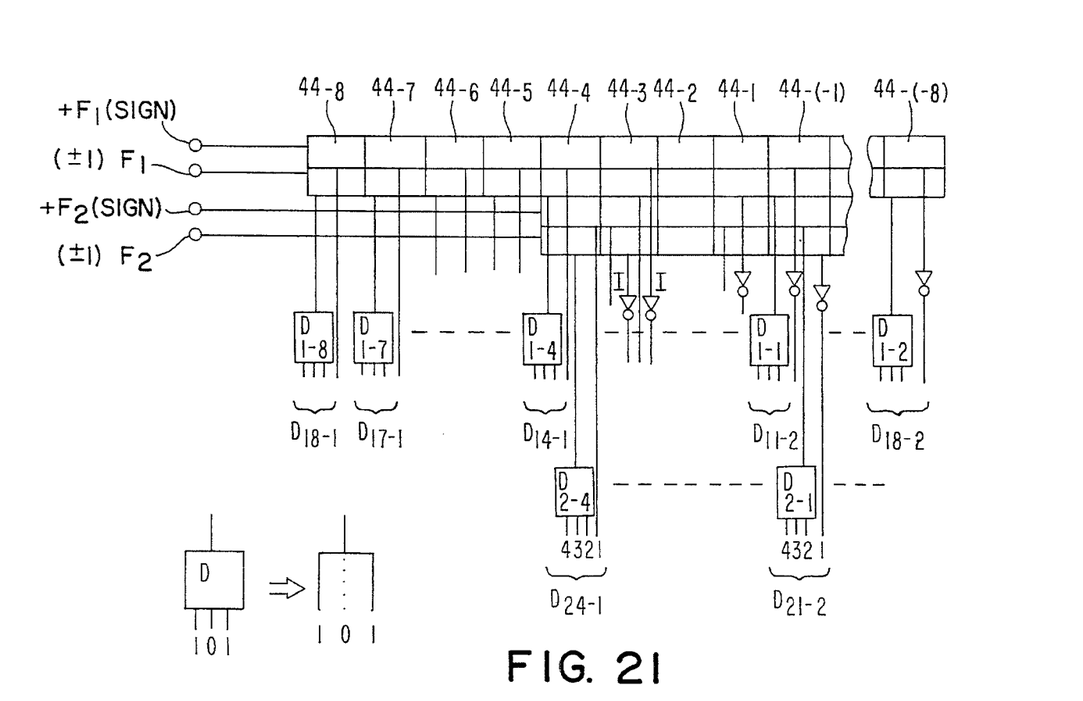
FIG. 21 is a block diagram of the data creation circuit 45 of FIG. 16.
Figure 22:
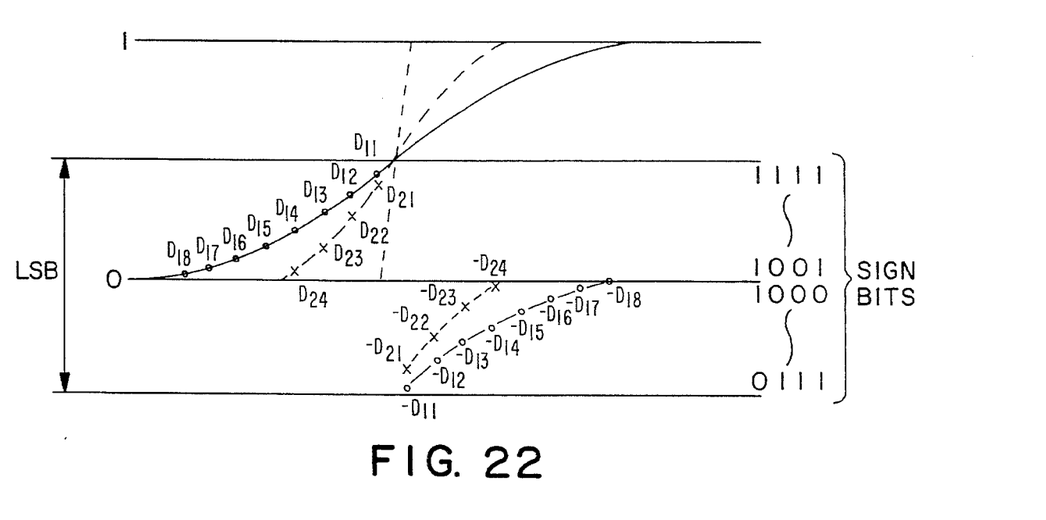
FIG. 22 is a diagram explaining the generated data signals.

Next, FIG. 21 is a block diagram which shows a data creation circuit 45 from the register output. Each of the registers 44-8-4-8 are divided to the left and the right from center. The output of the sign bits on the left side remain as they are, whereas on the right side, the sign bits are inverted through the inverter I. In addition, data from the left and right is put in from the center, respectively merging to become the same data. This data, as shown in FIG. 22, and with respect to F1 is such that there are 8 types of data, and in the range D11–D18, it is useful to utilize ¼ cycle components of the sine wave as shown in the diagram. This data is output following each register, as + or −1 LSB changes, i.e. output from a register in which F1 and F2 are output. For example, if F1 exists in register 44-8, and if F2 exists in register 44-4, these data are output from two locations. Naturally, the heterogeneous sign bits may also be output at the same time. In this instance, in the case of 4 bit data, other than the 'Sign', they are manifest as 3 bits.

Figure 23:
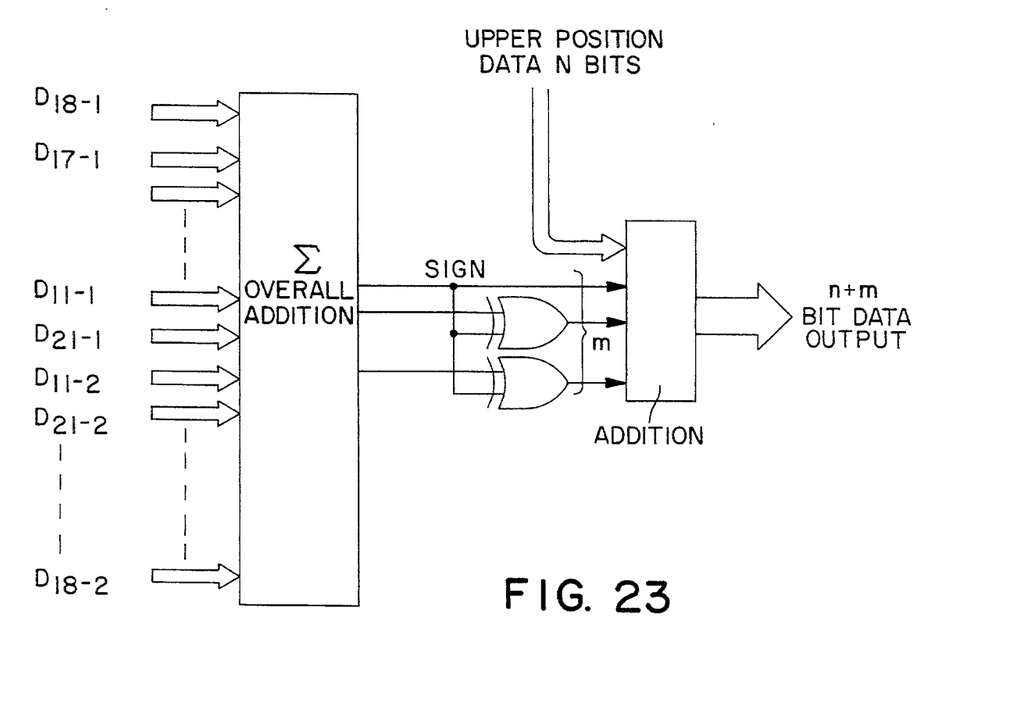
FIG. 23 is a diagram showing an example of a circuit used for data addition.

In FIG. 23, the output of data is accomplished by means of overall calculator Σ. Data calculations are abbreviated for various known reasons. Each data, as shown in FIG. 21, corresponds to the necessary data value, and may be produced only by wiring. In this instance, the data, as shown in FIG. 22, is such that a ¼ cycle of the sine wave is such that the positive data increases with respect to the + LSB change input as D18-D11 and D24-D21. Inserted from the center, it becomes negative data, and in an reverse rotation reduces towards 0. With −1 LSB, since sign bits are 0, it becomes a reverse data change, and the negative of the data is increased and inserted from the center becoming positive and reducing as it approaches 0.

According to this, data is obtained which corresponds to d2 and d2 shown in FIG. 17. By means of the calculated output of FIG. 20, this 1 output can be created such as the data of C shown in FIG. 17, and through the addition of the upper position data, data can be obtained in which there is a smooth bit length magnification and no distortion.

With this embodiment, an explanation has been provided with respect to two types of produced data. Naturally, these can correspond to increased broad frequency limits. Furthermore, they may also correspond to 2 LSB changes. Data which is produced and corresponds to 1 change, even though it is only one, may, owing to the overall addition of the output data of the change points, in terms of the continuity of the final data, correspond to the wave shape of changes of smooth broad frequencies.

As indicated above, according to this invention even though LSB changes may be accomplished through small signals, the output signal may correspond to the wave shape of smooth broad frequency changes, enabling the removal of noise produced by the occurrence of pulse distortions.

Modifications of the invention herein disclosed will occur to a person skilled in the art and all such modifications are deemed to be within the scope of this invention as defined by the appended claims.

What is claimed is:

1. A digital-to-analog conversion device, comprising means for detecting changes in least significant bits (LSB) of input data words as well as small signal in said data words in which there are no data changes; and filter means for outputting digital data indicative of changes smaller than said changes indicated by said least significant bits, to thereby to produce a smoothed analog signal free of audible high frequency noise; and a bit length magnification device having detection means for detecting minute level changes which are smaller than the level changes of a fixed level between successive data samples, and a low pass filter stage having a lower cutoff frequency than a prevailing frequency band; and data treatment means for outputting bits input in which the output bits of the filter calculation of lower order than the LSB of the bits output from said filter means, said lower order bits being added to said filter means output bits at a position wherein said added bits indicate smaller changes than said change indicated by said LSB.

2. The device according to claim 1, wherein said filter means are low pass filter means.

3. A digital-to-analog conversion device, comprising means for detecting timing patterns formed by changes in least significant bits (LSB) of input data words as well as intervals in said data words in which there are no data changes; and filter means for outputting digital data indicative of changes smaller than said changes indicated by said least significant bits, to thereby produce a smoothed analog signal free of audible high frequency noise; and a bit length magnification device for converting sample data rows obtained from fixed word bits lengths, said bit length magnification device comprising a detection stage extracting differential components from sample data and detecting minute level changes within the extracted data as well as change intervals, means for producing digital data indicative of changes smaller than said changes indicated by the LSB of the sample data in accordance with said detection, extending across multiple samples spanning said minute level changes, and means for calculating a data output for each said minute level change, said means for calculating a data output assigning said data to a lower order position than said LSB, thereby providing smooth level changes in the minute level change sequence using bits indicative of changes smaller than said changes indicated by said LSB, and which are added to the upper position of the sample.

* * * * *